United States Patent [19]

Beretta et al.

[11] Patent Number: 4,897,369

[45] Date of Patent: Jan. 30, 1990

[54] METHOD FOR SHAPING THE EDGES OF SLICES OF SEMICONDUCTOR MATERIAL

[75] Inventors: Giorgio Beretta; Antonino Inserra, both of Catania, Italy

[73] Assignee: SGS-Thompson Microelectronics S.p.A., Catania, Italy

[21] Appl. No.: 210,049

[22] Filed: Jun. 22, 1988

[30] Foreign Application Priority Data

Jun. 29, 1987 [IT] Italy .................................. 6615 A/87

[51] Int. Cl.[4] .......................................... H01L 21/304
[52] U.S. Cl. ...................................... 437/225; 51/317; 156/636; 156/658
[58] Field of Search .......................... 437/225; 51/317; 156/636, 637, 638, 639

[56] References Cited

U.S. PATENT DOCUMENTS

| 3,951,728 | 4/1976 | Egashira et al. | 156/600 |
| 4,588,473 | 5/1986 | Hisatomi et al. | 156/645 |
| 4,756,796 | 7/1988 | Saitou | 156/662 |

FOREIGN PATENT DOCUMENTS

| 54-33676 | 3/1979 | Japan | 437/225 |
| 55-143037 | 11/1980 | Japan | 437/225 |
| 59-117123 | 7/1984 | Japan | 156/638 |

OTHER PUBLICATIONS

Free, IBM Tech. Dis. Bull., vol. 19, No. 8 (Jan. 1977), pp. 3040–3041.
Craft, Circuits Manuf. (USA), vol. 17, No. 9 (Sep. 1977), pp. 47–50.

Primary Examiner—Olik Chaudhuri
Attorney, Agent, or Firm—Herbert Dubno

[57] ABSTRACT

The invention concerns a method in which the edge of the slices is made to slide in contact with the surfaces of a pad soaked in acid substances and in which, during the process, the areas of the edge of the slices that have been in contact with the pad are periodically washed with a special liquid.

5 Claims, 2 Drawing Sheets

METHOD FOR SHAPING THE EDGES OF SLICES OF SEMICONDUCTOR MATERIAL

FIELD OF THE INVENTION

This invention concerns a method for shaping the edges of slices of semiconductor material, especially epitaxial material, and to an apparatus for carrying out the method.

BACKGROUND OF THE INVENTION

In the technology of producing wafers or slices of semiconductor material, a recurring problem is that of shaping the edge of the slices in order to remove the circular protuberances ("epitaxial crowns") which form on the edge of the slices as a result of the growth on them of epitaxial layers and which, unless they are removed, can increase fragility of the slices and pose difficulties in the subsequent diffusion and photomasking operations.

In order to shape the edge and remove the epitaxial crown, currently known equipment carry out mechanical abrasion of the edge by means of diamond wheels or discs of abrasive paper.

This type of equipment, however, has the drawback of producing dust when in operation, and dust notoriously represents a source of contamination for semiconductor layers.

OBJECT OF THE INVENTION

It is the object of this invention to provide a method of shaping the edges of substrates of semiconductor material which does not present the aforesaid problem.

SUMMARY OF THE INVENTION

For this purpose, in the method according to the invention the edge of the slice is made to slide in contact with the surfaces of a pad soaked in an acid substance and, during the process, the areas that have been in contact with the pad are periodically washed with a liquid.

BRIEF DESCRIPTION OF THE DRAWINGS

These and other features of the invention will be more readily apparent from the following description and the accompanying drawing in which.

FIG. 2b is an end view of the pad of FIG. 2a;

SPECIFIC DESCRIPTION

Figure 1C:
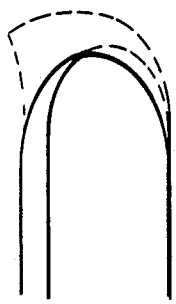
FIGS. 1a, 1b and 1c are schematic cross-sectional views of the edge of a slice, respectively, in the virgin state, after epitaxial growth, and after the shaping process according to the invention.
Figure 1B:
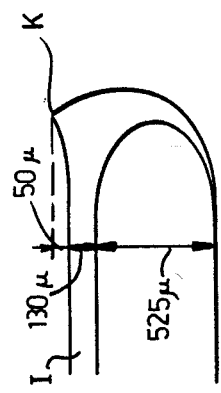
Figure 1A:
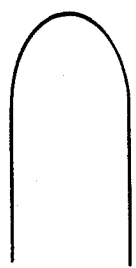

FIGS. 1a, 1b and 1c show a schematical cross-sectional view of the edge of the same slice, respectively, before the growth of an epitaxial layer (FIG. 1a), after growth (FIG. 1b) and, lastly, (FIG. 1c) at the end of the edge shaping process according to the invention. In particular, FIG. 1b shows the epitaxial crown K which forms along the edge during the growth of the epitaxial layer I, said crown being considerably higher (in the region of 40%) than the layer itself.

Figure 2B:
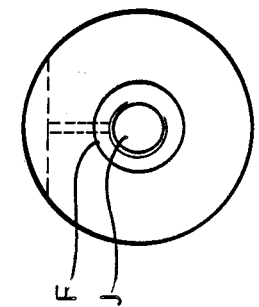
Figure 2A:
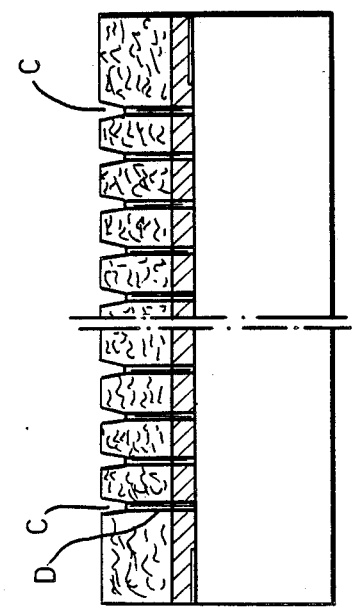
FIG. 2a is a fragmentary cross-sectional view of a pad used in the process according to the invention.

FIGS. 2a and 2b show a pad used in the process according to the invention. The pad consists of a cylinder-shaped body B made of flexible material resistant to the acids used in the process and capable of soaking up the acids.

The pad is provided on one side with a series of notches C, the cross-sections of which, according to a plane passing through the axis of the pad, are V-shaped. On the bottom of each notch is the mouth of a channel D which passes radially through the pad until it communicates with the internal cavity J of the cylinder F, which serves the dual purpose of supporting the pad and of conveying the acid substances.

The purpose of the channels is to enable the mixture of acids present in the cavity of the cylinder F (consisting, for example, of 10% hydrofluoric acid, 30% nitric acid and 60% acetic acid, by volume) to overflow into the channels themselves and then soak uniformly through the entire body of the pad.

Figure 4:
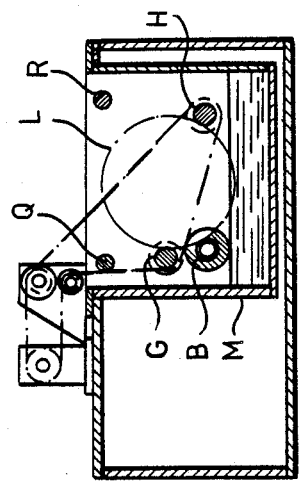
FIG. 4 is a cross-sectional view along the line A—A of FIG. 3.
Figure 5:
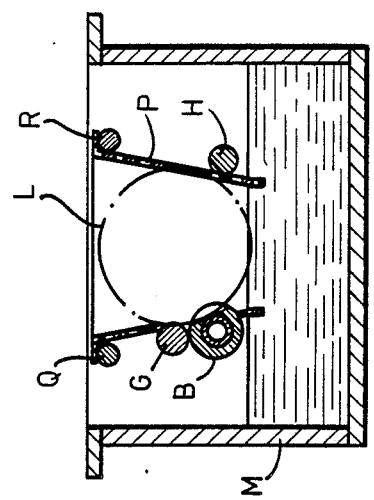
FIG. 5 is an enlarged view of a detail of FIG. 3.
Figure 3:
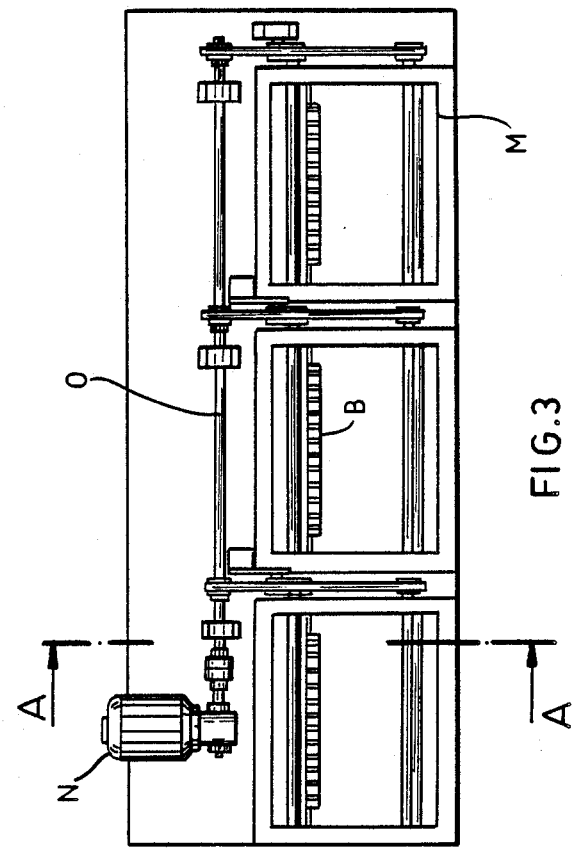
FIG. 3 is a plan view taken of an apparatus for carrying out the process according to the invention.

In the apparatus of FIGS. 3 and 4, the various parts represent:

B: a pad of the type shown in FIGS. 2a and 2b;

G and H: pairs of rollers;

L: a slice of semiconductor material resting on the rollers G and H and slidingly engaged by one part of its edge in a notch in the pad B;

M: a tank containing on the bottom continuously replaced deionized water;

N: a motor for driving the rollers G and H by means of a belt and pulley transmission system O; and Q and R: bars for supporting a slice-holding basket P (shown in FIG. 5).

FIG. 5 shows an enlarged view of the tank of FIG. 4, in which reference P indicates a basket-shaped container designed to receive the slices and to hold them in a vertical position and equally spaced apart from one another by means of slots on the right hand side and on the bottom of the basket. Said container is also provided with apertures in correspondence with the rollers G and H and with the pad B, which enable the edge of each slice to engage with the surface of the aforesaid cylinders and with a respective notch in the pad.

During the process, the slices in the container are caused to rotate around their own axes by means of the rollers G and H. As a result of the rotatory movement the edge of each slice brushes against the pad for one or more turns, thereby undergoing chemical attack by the acids in which the pad is soaked, with consequent removal of the surface in contact. The removal is lesser or greater in relation to the composition of the acid and to the number of turns made by the slices.

During the course of the rotatory movement, the area of the edge of the slice that has been in contact with the pad runs through the water both on the bottom of the tank (which is continuously replaced by means of inlet and outlet apertures, not visible in the drawings), thus quenching any acid which may still remain on the surface of the slice.

It is obvious that numerous modifications, adjustments or replacement of elements with other functionally equivalent elements may be made to the previously described embodiments, given by way of illustration, without however deviating from the scope of the following claims.

In particular, it is obvious that the shape of the notches in the pad shown in FIG. 2 (which is symmetrical with respect to the planes perpendicular to the axis of the pad and crossing trough the axis of each channel) is not binding. In fact, said notches may be differently shaped and, in particular, asymmetrical whenever it is desired to obtain an equally asymmetrical shape on the edge of the slices.

We claim:

1. A method of shaping an edge of a slice of a semiconductor material, comprising the steps of:
   (a) sliding an edge of a slice of a semiconductor material in cyclic contact with a surface of a pad soaked with an acid substance capable of dissolving material from said slice;
   (b) periodically washing portions of the edge of said slice with deionized water; and
   (c) contacting said portions after washing with the deionized water again with said pad, said deionized water being provided in a bath below said pad, said slice is round, and said edge is slid in contact with said surface of said pad by rotating said slice to displace said edge through a notch formed in said pad and then through said bath.

2. The method defined in claim 1, further comprising the step of continuously replacing said bath.

3. The method defined in claim 2 wherein said slice is rotated in a vertical plane.

4. The method defined in claim 3 wherein a plurality of said slices are rotated simultaneously through respective notches in said pad and then into said bath.

5. The method defined in claim 4 wherein said slices are rotated by supporting them on a pair of parallel rollers and rotating said rollers.

* * * * *

UNITED STATES PATENT AND TRADEMARK OFFICE
CERTIFICATE OF CORRECTION

PATENT NO. : 4,897,369

DATED : 30 January 1990

INVENTOR(S) : Giorgio BERETTA and Antonino INSERRA

It is certified that error appears in the above-identified patent and that said Letters Patent is hereby corrected as shown below:

On the Cover Page:

Item [73] (Assignee) should read:

--SGS-THOMSON Microelectronics SpA, Catania, Italy-- .

Signed and Sealed this

Twenty-seventh Day of November, 1990

*Attest:*

HARRY F. MANBECK, JR.

*Attesting Officer*         *Commissioner of Patents and Trademarks*